United States Patent
Aoki

(10) Patent No.: US 9,431,986 B2
(45) Date of Patent: Aug. 30, 2016

(54) SOUND PROCESSING APPARATUS AND SOUND PROCESSING METHOD

(71) Applicant: YAMAHA CORPORATION, Hamamatsu-shi, Shizuoka (JP)

(72) Inventor: Ryotaro Aoki, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 411 days.

(21) Appl. No.: 13/722,143

(22) Filed: Dec. 20, 2012

(65) Prior Publication Data

US 2013/0163782 A1  Jun. 27, 2013

(30) Foreign Application Priority Data

Dec. 21, 2011  (JP) .................................. 2011-279575

(51) Int. Cl.
*H03G 5/00* (2006.01)
*H03G 9/00* (2006.01)
*H03G 9/02* (2006.01)

(52) U.S. Cl.
CPC ............... *H03G 9/005* (2013.01); *H03G 9/025* (2013.01)

(58) Field of Classification Search
CPC . G10L 19/0204; G10L 21/038; G10L 19/167; G10L 19/008; G10L 21/0388; G10L 19/18; G10L 19/00; G10L 19/0208; G10L 21/0208; H03G 9/025; H03G 7/002; H03G 9/005; H03G 3/20; H03G 7/00; H03G 9/18; H03G 11/00; H03G 3/001; H03G 5/165; H04B 1/662; H04R 2420/07; H04R 25/356; H04R 25/502; H04R 25/70; H04R 5/04; H04R 5/02; H04R 1/26; H04H 60/04; H04H 20/88; H04S 3/02; H04S 1/002; G10H 1/16; G10K 11/01

USPC ............. 381/106, 119, 98, 104, 107, 22, 108, 381/23, 94.1, 94.2, 94.3, 97, 1, 103, 190, 2, 381/20, 304, 320, 335, 336, 61, 71.8, 73.1
See application file for complete search history.

(56) References Cited

U.S. PATENT DOCUMENTS 5,185,806 A * 2/1993 Dolby .................... H03G 9/005 333/14
6,829,360 B1 * 12/2004 Iwata .................... G10L 21/038 381/61

(Continued)

FOREIGN PATENT DOCUMENTS

JP  11-145860 A  5/1999
JP  2004-184472 A  7/2004

(Continued)

OTHER PUBLICATIONS

Japanese Office Action dated Nov. 5, 2013 with English translation (four (4) pages).

*Primary Examiner* — Akelaw Teshale
(74) *Attorney, Agent, or Firm* — Crowell & Moring LLP

(57) ABSTRACT

A sound processing apparatus includes an information acquisition unit which acquires control information including at least one of mode information for designating a reproduction mode of the sound processing apparatus and attribute information for designating an attribute of an audio content represented by a sound signal, a frequency band expansion unit which performs frequency band expansion processing for adding an expanded component generated from the sound signal to the sound signal, and a control unit which changes parameters to be applied to the frequency band expansion processing in accordance with the control information acquired by the information acquisition unit.

8 Claims, 2 Drawing Sheets

(56) References Cited

U.S. PATENT DOCUMENTS

| | | |
|---|---|---|
| 7,509,103 B2 | 3/2009 | Ozaki |
| 7,940,941 B2 | 5/2011 | Akiyama et al. |
| 8,130,967 B2 * | 3/2012 | Kino .................. H04S 7/301 381/58 |
| 2007/0160231 A1 | 7/2007 | Akiyama et al. |
| 2008/0254753 A1 * | 10/2008 | Steenstra ............. H04R 5/04 455/90.1 |
| 2010/0121634 A1 * | 5/2010 | Muesch ............ G10L 21/0205 704/224 |
| 2011/0119055 A1 * | 5/2011 | Lee .................... G10L 19/008 704/205 |
| 2011/0196523 A1 | 8/2011 | Akiyama et al. |
| 2011/0249843 A1 * | 10/2011 | Holmberg ........... H04R 25/353 381/316 |
| 2011/0267440 A1 * | 11/2011 | Kim .................... G06T 7/0022 348/55 |

FOREIGN PATENT DOCUMENTS

| | | |
|---|---|---|
| JP | 2005-114813 A | 4/2005 |
| JP | 2005-318225 A | 11/2005 |
| JP | 2006-109233 A | 4/2006 |
| JP | 2007-52331 A | 3/2007 |
| JP | 2007-178675 A | 7/2007 |
| JP | 2007-328268 A | 12/2007 |
| JP | 2010-85876 A | 4/2010 |

* cited by examiner

FIG.4

TBL1

|  | F[H] | D[H] | G[H] | G[L] | V |
|---|---|---|---|---|---|
| MOVIE | 4 kHz | 4 kHz | g0 (SMALL) | g1 (MEDIUM) | v0 (WEAK) |
| MUSIC | 10 kHz | 6 kHz | g1 (MEDIUM) | g1 (MEDIUM) | v1 (MEDIUM) |
| VIDEO GAME | 8 kHz | 8 kHz | g1 (MEDIUM) | g2 (LARGE) | v2 (STRONG) |

FIG.5

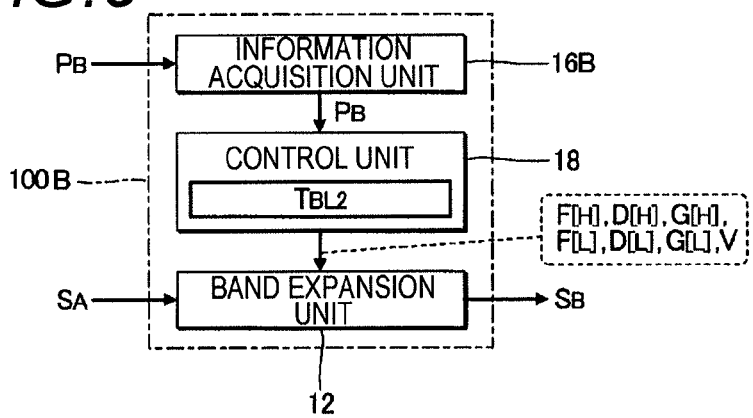

FIG.6

TBL2

|  | F[H] | D[H] | G[H] | G[L] | V |
|---|---|---|---|---|---|
| POP | 10 kHz | 6 kHz | g1 (MEDIUM) | g0 (SMALL) | v1 (MEDIUM) |
| CLASSIC | 10 kHz | 6 kHz | g1 (MEDIUM) | g1 (MEDIUM) | v1 (MEDIUM) |
| JAZZ | 8 kHz | 8 kHz | g0 (SMALL) | g0 (SMALL) | v1 (MEDIUM) |

FIG.7

TBL3

|  | F[H] | D[H] | G[H] | G[L] | V |
|---|---|---|---|---|---|
| PAST RECORDING | 8 kHz | 8 kHz | g1 (MEDIUM) | g1 (MEDIUM) | v1 (MEDIUM) |
| NEW RECORDING | 10 kHz | 6 kHz | g0 (SMALL) | g0 (SMALL) | v1 (MEDIUM) |

SOUND PROCESSING APPARATUS AND SOUND PROCESSING METHOD

BACKGROUND

1. Technical Field

The present invention relates to a technique for processing a sound signal.

2. Background Art

In audio compression, such as MP3 (MPEG-1 Audio Layer III) or AAC (Advanced Audio Coding), since the band components in a high-tone band and a low-tone band of a sound signal are removed (i.e., band limiting), there is a problem in that the sound quality of reproduced sound is degraded. As a technique for suppressing degradation of sound quality due to band limiting, for example, JP-A-2007-178675 discloses processing (hereinafter, referred to as "band expansion processing") for reinforcing a high-tone band and a low-tone band using specified band components of a sound signal.

SUMMARY

The conditions (upper limit frequency, lower limit frequency, bandwidth) of the frequency of a band component used for reinforcing the high-tone band or the low-tone band of the sound signal or the optimum values of various parameters, such as the degree of addition, may differ depending on, for example, the type of information (audio content) expressed by the sound signal. However, according to the technique of JP-A-2007-178675, since each parameter of the band expansion processing is fixed at a predetermined value, in some cases, the sound quality of reproduced sound is not sufficiently improved in accordance with the characteristics of the sound signal (for example, a difference specific to genre in information represented by the sound signal). While a configuration in which each parameter of the band expansion processing is controlled in accordance with the analysis result of the frequency characteristics of the sound signal may be assumed, there is a problem in that a processing load of frequency analysis increases. An object of the invention is to execute appropriate band expansion processing while suppressing a processing load.

An aspect of the present invention provides a sound processing apparatus, including: an information acquisition unit which acquires control information including at least one of mode information for designating a reproduction mode of the sound processing apparatus and attribute information for designating an attribute of an audio content represented by a sound signal; a frequency band expansion unit which performs frequency band expansion processing for adding an expanded component generated from the sound signal to the sound signal; and a control unit which changes parameters to be applied to the frequency band expansion processing in accordance with the control information acquired by the information acquisition unit.

BRIEF DESCRIPTION OF THE DRAWINGS

In the accompanying drawings:

FIG. 4 is a schematic view of a variable table;

FIG. 5 is a block diagram of a sound processing apparatus according to a second embodiment;

FIG. 6 is a schematic view of a variable table in a third embodiment; and

FIG. 7 is a schematic view of a variable table in a fourth embodiment.

DETAILED DESCRIPTION

Figure 1:
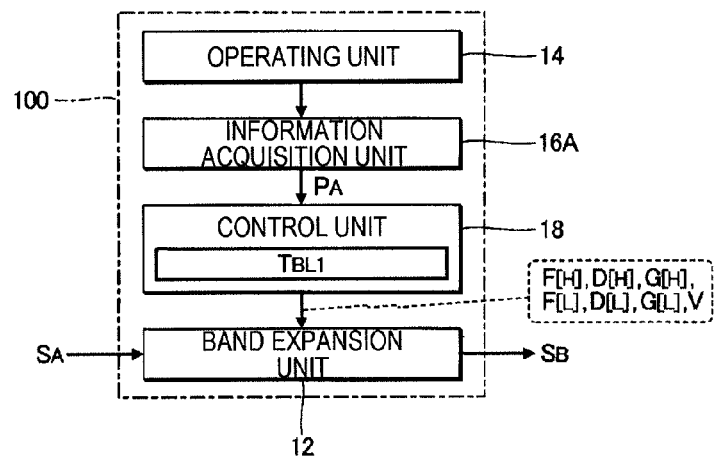
FIG. 1 is a block diagram of a sound processing apparatus according to a first embodiment.

An aspect of the present invention provides a sound processing apparatus, including: an information acquisition unit which acquires control information including at least one of mode information for designating a reproduction mode of the sound processing apparatus and attribute information for designating an attribute of an audio content represented by a sound signal; a frequency band expansion unit which performs frequency band expansion processing for adding an expanded component generated from the sound signal to the sound signal; and a control unit which changes parameters to be applied to the frequency band expansion processing in accordance with the control information acquired by the information acquisition unit. According to this aspect, it is possible to execute appropriate frequency band expansion processing according to the characteristics of the sound signal to be processed. Furthermore, since each parameter of the frequency band expansion processing may be set in accordance with an instruction from the user or the attribute of information represented by the sound signal, there is an advantage in that the frequency analysis or the like of the sound signal is not required. Note that a typical example of the sound signal is a signal frequency-band-limited by audio compression.

While the kind of each parameter which is controlled by the control unit is arbitrary, for example, in a configuration in which the frequency band expansion unit shifts the fundamental component in the specified frequency band of the sound signal on the frequency domain to generate the expanded component, the control unit can control at least one of the specified frequency band (for example, low limit frequency, upper limit frequency, bandwidth, or frequency range) and the shift amount of the fundamental component in accordance with the control information. According to the above configuration, it is possible to appropriately control the position (frequency and bandwidth) on the frequency domain of the fundamental component to be enhanced by the frequency band expansion processing and the frequency with the added fundamental component in accordance with the control information.

The sound processing apparatus may be configured so that the frequency band expansion processing includes processing for adjusting an intensity of the expanded component, and the control unit controls an adjustment value of the intensity of the expanded component in accordance with the control information acquired by the information acquisition unit. According to the above configuration, it is possible to appropriately control the degree of addition of an expanded component in accordance with the control information.

The sound processing apparatus may be configured so that the information acquisition unit acquires, from a broadcast signal including the sound signal, attribute information for designating the type of information represented by the broadcast signal. In the above configuration, since the information acquisition unit acquires the attribute information associated with the sound signal from the broadcast signal, for example, the necessity for the user to select the reproduction mode can, in principle, be eliminated.

The sound processing apparatus according to each form described above may be realized by hardware (electronic circuit), such as a dedicated DSP (Digital Signal Processor)

for processing of a sound signal or realized by the cooperation of a general-purpose arithmetic processing unit, such as a CPU (Central Processing Unit), and a program. The program causes a computer to function as: an information acquisition unit which acquires control information including at least one of mode information for designating a reproduction mode of the sound processing apparatus and attribute information for designating an attribute of an audio content represented by a sound signal; a frequency band expansion unit which performs frequency band expansion processing for adding an expanded component generated from the sound signal to the sound signal; and a control unit which variably controls parameters to be applied to the frequency band expansion processing in accordance with the control information acquired by the information acquisition unit. According to the above program, the same actions and effects as the sound processing apparatus according to the invention are realized. The program is provided in the form of being stored in a computer-readable recording medium and installed on a computer, or is provided in the form of being distributed through a communication network and installed on a computer.

The aspect of the invention may be specified as a method of processing a sound signal. A sound processing method according to another aspect of the invention includes acquiring control information including at least one of mode information for designating a reproduction mode of a sound processing apparatus and attribute information for designating an attribute of an audio content represented by a sound signal; executing frequency band expansion processing for adding an expanded component generated from the sound signal to the sound signal; and variably controlling parameters to be applied to the frequency band expansion processing in accordance with the acquired control information. According to the above method, the same actions and effects as the sound processing apparatus according to the invention are realized.

First Embodiment

FIG. 1 is a block diagram of a sound processing apparatus 100 according to a first embodiment of the invention. A sound signal SA is supplied to the sound processing apparatus 100. The sound signal SA is a signal which is obtained by decompressing a signal which has been compressed in a format of MP3, AAC, or the like, and a high-tone band and a low-tone band are reduced by band limiting during audio compression compared to the uncompressed signal. The sound processing apparatus 100 is a signal processing apparatus which generates a sound signal SB from the sound signal SA by reinforcing the high-tone band and the low-tone band of the sound signal SA. The sound processing apparatus 100 is suitably used as audio equipment, such as an AV (Audio-Visual) receiver or an AV amplifier.

As shown in FIG. 1, the sound processing apparatus 100 includes a band expansion unit 12, an operating unit 14, an information acquisition unit 16A, and a control unit 18. The respective units (the band expansion unit 12, the information acquisition unit 16A, and the control unit 18) of the sound processing apparatus 100 are realized by, for example, a general-purpose arithmetic processing unit which executes a program or a dedicated electronic circuit (DSP (Digital Signal Processor)) for processing of the sound signal SA.

Figure 2:
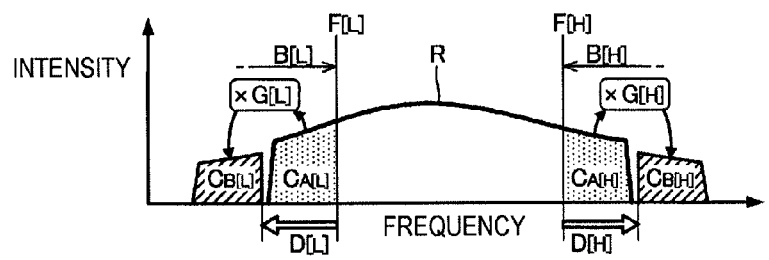
FIG. 2 is an explanatory view of band expansion processing.

The band expansion unit 12 sequentially executes band expansion processing on the sound signal SA in a predetermined cycle. FIG. 2 is an explanatory view of band expansion processing. The frequency characteristics R of the sound signal SA in which the high-tone band and the low-tone band are reduced is shown in FIG. 2.

The band expansion processing includes high-band expansion processing for reinforcing the high-tone band of the sound signal SA and low-band expansion processing for reinforcing the low-tone band of the sound signal SA. The high-band expansion processing is processing for generating an expanded component CB[H] from a fundamental component CA[H] of the sound signal SA in a specified band B[H] on the high-band side and adding the expanded component CB[H] to the sound signal SA. The fundamental component CA[H] is a sound component of the sound signal SA which exceeds a high-band frequency F[H], and the expanded component CB[H] is a sound component in which the fundamental component CA[H] is shifted by a variation D[H] toward the high-band side on the frequency domain and intensity is adjusted in accordance with an adjustment value (gain) G[H]. The low-band expansion processing is processing for generating an expanded component CB[L] from a fundamental component CA[L] of the sound signal SA in a specified band B[L] on the low-band side and adding the expanded component CB[L] to the sound signal SA. The fundamental component CAN is a sound component of the sound signal SA which falls below a low-band frequency F[L] (F[L]<F[H]), and the expanded component CB[L] is a sound component in which the fundamental component CA[L] is shifted by a variation D[L] toward the low-band side on the frequency domain and intensity is adjusted in accordance with an adjustment value G[L].

Figure 3:
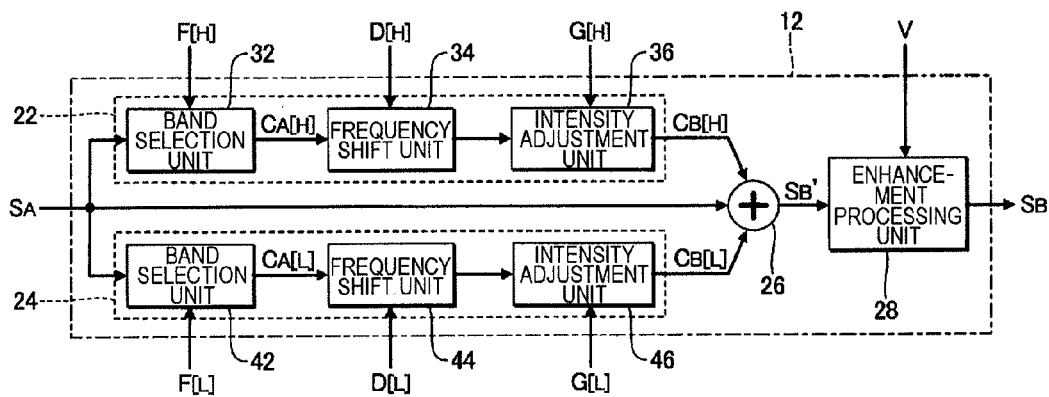
FIG. 3 is a block diagram of a band expansion unit.

FIG. 3 is a block diagram of the band expansion unit 12. As shown in FIG. 3, the band expansion unit 12 includes a high-band expansion unit 22, a low-band expansion unit 24, a synthesis unit 26, and an enhancement processing unit 28. The sound signal SA is supplied to the high-band expansion unit 22, the low-band expansion unit 24, and the synthesis unit 26.

The high-band expansion unit 22 is a unit which executes the high-band expansion processing on the sound signal SA to generate the high-band expanded component CB[H]. The high-band expansion unit 22 includes a band selection unit 32, a frequency shift unit 34, and an intensity adjustment unit 36. The band selection unit 32 extracts the fundamental component CA[H] in the specified band B[H] shown in FIG. 2 from the sound signal SA. A high-pass filter which selectively transmits the fundamental component CA[H] in the specified band B[H] of the sound signal SA beyond the frequency (cutoff frequency) F[H] is used as the band selection unit 32.

The frequency shift unit 34 shifts the fundamental component CA[H] generated by the band selection unit 32 by the variation D[H] toward the high-band side on the frequency domain. In regard to the shift of the fundamental component CA[H], a known technique may be arbitrarily used. The intensity adjustment unit 36 adjusts the intensity of a component after the processing of the frequency shift unit 34 in accordance with the adjustment value G[H] to generate the expanded component CB[H]. Specifically, a multiplier which multiplies a component after the processing of the frequency shift unit 34 by the adjustment value G[H] (0≤[H]) is suitably used as the intensity adjustment unit 36. The cutoff frequency F[H] of the band selection unit 32, the variation D[H] which is applied to the frequency shift unit 34, and the adjustment value G[H] which is applied to the intensity adjustment unit 36 may be individually adjusted.

The low-band expansion unit 24 of FIG. 3 is a unit which executes the low-band expansion processing on the sound signal SA to generate the low-band expanded component CB[L]. The low-band expansion unit 24 includes a band selection unit 42, a frequency shift unit 44, and an intensity adjustment unit 46. The band selection unit 42 extracts the fundamental component CA[L] in the specified band B[L]

shown in FIG. 2 from the sound signal SA. A low-pass filter which selectively transmits the fundamental component CA[L] in the specified band B[L] of the sound signal SA below the frequency F[L] is used as the band selection unit 42.

The frequency shift unit 44 shifts the fundamental component CA[L] generated by the band selection unit 42 by the variation D[L] toward the low-band side on the frequency domain. In regard to the shift of the fundamental component CA[L], a known technique may be arbitrarily used. The intensity adjustment unit 46 adjusts the intensity of a component after the processing of the frequency shift unit 44 in accordance with the adjustment value G[L] (for example, multiplies the adjustment value G[L]) to generate the expanded component CB[L] (0≤G[L]). The cutoff frequency F[L] of the band selection unit 42, the variation D[L] which is applied to the frequency shift unit 44, and the adjustment value G[L] which is applied to the intensity adjustment unit 46 may be individually adjusted.

The synthesis unit 26 of FIG. 3 adds the high-band expanded component CB[H] generated by the high-band expansion unit 22 and the low-band expanded component CB[L] generated by the low-band expansion unit 24 to the sound signal SA to generate a sound signal SB'. Specifically, an adder which adds the expanded component CB[H] and the expanded component CB[L] to the sound signal SA may be used as the synthesis unit 26. There can be adopted a configuration in which the sound signal SA is supplied to the synthesis unit 26 after the intensity of the sound signal SA is appropriately adjusted, or a configuration in which the sound signal SA, the expanded component CB[H], and the expanded component CB[L] are supplied to the synthesis unit 26 after an appropriate delay is added to each of the sound signal SA, the expanded component CB[H], and the expanded component CB[L].

The enhancement processing unit 28 adjusts the intensity of the high-tone band or the low-tone band of the sound signal SB' generated by the synthesis unit 26 to generate the sound signal SB. The enhancement processing unit 28 in the first embodiment has a high shelving filter which adds the high-tone band of the sound signal SB' and a low shelving filter which adds the low-tone band of the sound signal SB'. The degree of enhancement of the high-tone band and the low-tone band of the enhancement processing unit 28 (hereinafter, referred to as "degree of enhancement") V is variably controlled. A specific example of the configuration of the band expansion unit 12 has been described as above.

The operating unit 14 of FIG. 1 is a unit which receives an instruction from the user, and includes a plurality of operators which are operable by the user. The user can appropriately operate the operating unit 14 to select the reproduction mode of the sound signal SB. The information acquisition unit 16A acquires mode information PA which designates a reproduction mode selected by a user's operation on the operating unit 14.

In the first embodiment, a reproduction mode desired by the user is selected from a movie mode, a music mode, and a video game mode. The movie mode is a reproduction mode which is suitable for reproducing audio (words or sound effects) of a movie, the music mode is a reproduction mode which is suitable for reproducing music, and the video game mode is a reproduction mode which is suitable for reproducing audio (for example, sound effects) of a video game. Accordingly, there is a high possibility that the sound signal SA of audio of a movie is supplied in a state where the movie mode is selected, the sound signal SA of music is supplied in a state where the music mode is selected, and the sound signal SA of audio of a video game is supplied in a state where the video game mode is selected.

The control unit 18 of FIG. 1 variably controls the parameters to be applied to the band expansion processing of the band expansion unit 12 in accordance with the mode information PA acquired by the information acquisition unit 16A. The control unit 18 in the first embodiment can control the cutoff frequency (the lower limit frequency of the specified band B[H]) F[H], the variation D[H], and the adjustment value G[H] to be applied to the high-band expansion processing, the cutoff frequency (the upper limit frequency of the specified band B[L]) F[L], the variation N|A and the adjustment value G[L] to be applied to the low-band expansion processing, and the degree of enhancement V to be applied to the enhancement processing unit 28 in accordance with the mode information PA. Although in the following description, for convenience, a case where the cutoff frequency F[L] and the variation D[L] are fixed at predetermined values is assumed, the cutoff frequency F[L] and the variation D[L] may be controlled in accordance with the mode information PA.

For setting each parameter in the control unit 18, a variable table TBL1 of FIG. 4 is used. As shown in FIG. 4, the variable table TBL1 is a data table in which the numerical values of the parameters (F[H], D[H], G[H], G[L], V) of the band expansion processing are registered for a plurality of kinds of reproduction modes (movie mode, music mode, video game mode). The control unit 18 instructs the numerical values of the parameters registered in the variable table TBL1 for a reproduction mode designated by the mode information PA to the band expansion unit 12.

Each of the adjustment value G[H] and the adjustment value G[L] is set to one of a numerical value g1 which enhances the expanded component (CB[H], CB[L]) moderately, a numerical value (a numerical value which decreases the degree of enhancement of an expanded component) g0 below the numerical value g1, and a numerical value (a numerical value which increases the degree of enhancement of an expanded component) g2 beyond the numerical value g1 (0≤g0<g1<g2≤1). The degree of enhancement V is set to one of a numerical value v1 which enhances the high-tone band and the low-tone band of the sound signal SB' moderately, a numerical value v0 which decreases the degree of enhancement of the high-tone band and the low-tone band, and a numerical value v2 which increases the degree of enhancement of the high-tone band and the low-tone band.

In the case of audio of a movie, since words are important, when the mode information PA designates the movie mode, the numerical values of the parameters are set such that the band of speech (vocalized sound) is enhanced. Specifically, as shown in FIG. 4, the control unit 18 sets the cutoff frequency F[H] to 4 kHz and sets the variation D[H] to 4 kHz such that a main component of speech is included in the fundamental component CAM. The control unit 18 sets the adjustment value G[H] to the numerical value g0, sets the adjustment value G[L] to the numerical value g1, and sets the degree of enhancement V to the numerical value v0.

In the case of music having performance sound of a plurality of musical instruments, since the high-tone band and the low-tone band are important compared to audio of a movie focusing on words, when the mode information PA designates the music mode, the numerical values of the parameters are set such that the high-tone band the low-tone band are enhanced compared to the movie mode. Specifically, as shown in FIG. 4, the control unit 18 sets both of the high-band adjustment value G[H] and the low-band adjustment value G[L] to the numerical value g1, and sets the degree of enhancement V to the numerical value v1. The cutoff frequency F[H] is set to 10 kHz, and the variation D[H] is set to 6 kHz.

In the case of a video game, since the power (feeling of volume) of audio of the high-tone band or the low-tone band is important compared to movie and music, when the mode information PA designates the video game mode, the numerical values of the parameters are set such that the high-tone band or the low-tone band is enhanced to be equal to or more than the movie mode or the music mode. In a video game, there is a tendency that powerful base (for example, flamboyant sound effect, such as blast)) is preferred, the numerical values of the parameters are set such that the low-tone band is particularly enhanced compared to the high-tone band. Specifically, as shown in FIG. 4, the control unit 18 sets the high-band adjustment value G[H] to the numerical value g1, sets the low band adjustment value G[L] to the numerical value g2, and sets the degree of enhancement V to the numerical value v2. The cutoff frequency F[H] is set to 8 kHz, and the variation D[H] is set to 8 kHz.

As described above, in the first embodiment, the numerical values of the parameters of the band expansion processing are variably controlled in accordance with the mode information PA which designates the reproduction mode selected by the user. Therefore, it is possible to execute appropriate band expansion processing in accordance with information (content) represented by the sound signal SA. Furthermore, since the parameters of the band expansion processing are set in accordance with an instruction from the user, the frequency analysis or the like of sound signal SA is not required. Therefore, according to the first embodiment, there is an advantage in that appropriate band expansion processing can be executed while suppressing a processing load.

Second Embodiment

A second embodiment of the invention will be described below. In each form illustrated below, the units which have the same actions or functions as the first embodiment are represented by the same reference numerals as those in the description of the first embodiment, and detailed description will be appropriately omitted.

FIG. 5 is a block diagram of a sound processing apparatus 100B according to the second embodiment. The sound processing apparatus 100B of the second embodiment has a configuration in which the operating unit 14 and the information acquisition unit 16A of the first embodiment are substituted with an information acquisition unit 16B. The information acquisition unit 16B acquires attribute information PB which designates the attribute of information (content) represented by a sound signal SA.

A broadcast signal obtained by receiving and demodulating a television broadcast wave, such as a terrestrial digital broadcast wave, includes the sound signal SA and the attribute information PB along with an image signal. The attribute information PB in the second embodiment designates the type (for example, the genre of a broadcast production represented by the broadcast signal) of information represented by the sound signal SA. The sound signal SA and the attribute information PB are extracted from the broadcast signal, the sound signal SA is supplied to the band expansion unit 12, and the attribute information PB is instructed to the information acquisition unit 16B.

The operation (band expansion processing) or configuration of the band expansion unit 12 is the same as the first embodiment. The control unit 18 variably controls the parameters (F[H], D[H], G[H], F[L], D[L], G[L], V) of the band expansion processing in accordance with the attribute information PB acquired by the information acquisition unit 16B. For example, when the attribute information PB designates movie, the parameters of the band expansion processing are set in the same manner as the movie mode of the first embodiment. When the attribute information PB designates music, the parameters of the band expansion processing are set in the same manner as the music mode of the first embodiment.

In the second embodiment, the numerical values of the parameters of the band expansion processing are variably controlled in accordance with the attribute information PB which designates the attribute of information represented by the sound signal SA. For this reason, as in the first embodiment, appropriate band expansion processing can be executed while suppressing a processing load. Furthermore, in the second embodiment, since the information acquisition unit 16B acquires the attribute information PB associated with the sound signal SA, the selection of the reproduction mode of the user is not required. Therefore, there is an advantage in that the load of the user is reduced. The first embodiment and the second embodiment may be combined, and the numerical values of the parameters of the band expansion processing can be controlled in accordance with both of the mode information PA (first embodiment) which designates the reproduction mode and the attribute information PB (second embodiment) which designates the attribute of information represented by the sound signal SA.

Third Embodiment

A sound processing apparatus 100B in a third embodiment has the same configuration as the second embodiment (FIG. 5). While the information acquisition unit 16B in the second embodiment acquires the attribute information PB from the broadcast signal, an information acquisition unit 16B in the third embodiment acquires attribute information PB associated with a music file (for example, a file in a format of MP3, AAC, or the like) in which the sound signal SA that is not uncompressed yet is included. The attribute information PB designates the type (genre) of music expressed by the sound signal SA. For example, one of pop, classic, and jazz is designated by the attribute information PB.

The control unit 18 variably controls the parameters (F[H], D[H], G[H], F[L], D[L], G[L], V) of the band expansion processing in accordance with the attribute information PB acquired by the information acquisition unit 16B. For the control of the parameters, a variable table TBL2 of FIG. 6 is used.

In the case of music which is classified into pop, the low-tone band of the sound signal SA is often enhanced in advance so as to make reproduced sound powerful. Accordingly, when the attribute information PB designates pop, the numerical values of the parameters are set such that the enhancement of the low-tone band is suppressed compared to the enhancement of the high-tone band. Specifically, as shown in FIG. 6, the control unit 18 sets the high-band adjustment value to the numerical value g1, sets the low-band adjustment value G[L] to the numerical value g0, and sets the degree of enhancement V to the numerical value v1. The cutoff frequency F[H] is set to 10 kHz, and the variation D[H] is set to 6 kHz.

In the case of music represented by, classic, reproduced sound in which moderate volume is maintained over the entire band from the low-tone band to the high-tone band is preferred. Accordingly, when the attribute information PB designates classic, the numerical values of the parameters are set such that the high-tone band and the low-tone band are enhanced equally. Specifically, as shown in FIG. 6, the control unit 18 sets both of the high-band adjustment value G[H] and the low-band adjustment value G[L] to the numerical value g1, and sets the degree of enhancement V to the numerical value v1. Similarly to pop, the cutoff frequency F[H] is set to 10 kHz, and the variation D[H] is set to 6 kHz.

Music which is classified into jazz is often performed by a small organization, and reproduced sound in which moderate volume is maintained within a specified band corresponding to the band of each musical instrument is preferred. That is, it is not necessary to enhance the high-tone band or the low-tone band excessively. Accordingly, when the attribute information PB designates jazz, the numerical values of the parameters are set such that the enhancement of the high-tone band or the low-tone band is suppressed compared to classic. Specifically, as shown in FIG. 6, the control unit 18 sets both of the high-band adjustment value G[H] and the low-band adjustment value G[L] to the numerical value g0, and sets the degree of enhancement V to the numerical value v1. The cutoff frequency F[H] is set to 8 kHz, and the variation D[H] is set to 8 kHz. In the third embodiment, the same effects as in the second embodiment are realized.

Fourth Embodiment

A sound processing apparatus 100B in a fourth embodiment has the same configuration as the second embodiment (FIG. 5). As in the third embodiment, an information acquisition unit 16B acquires attribute information PB associated with a music file before the decompression of a sound signal SA. The attribute information PB in the fourth embodiment designates the recording reference time of music expressed by the sound signal SA as the attribute of music. The recording reference time refers to date and time according to the recording time of the sound signal SA, and conceptually includes, for example, the publication date and time or the release date and time of music of the sound signal SA in addition to the recording date and time of the sound signal SA.

The control unit 18 variably controls the respective parameters (F[H], D[H], G[H], F[L], D[L], G[L], V) of the band expansion processing in accordance with the attribute information PB acquired by the information acquisition unit 16B. For the control of each parameter, a variable table TBL3 of FIG. 7 is used.

There are many cases where, in the sound signal SA recorded at an old time from now, the volume in both of the high-tone band and the low-tone band is not sufficient due to restriction on the performance of recording equipment. Accordingly, when the recording reference time designated by the attribute information PB is before a predetermined date and time, the numerical value of each parameter is set such that both of the high-tone band and the low-tone band are enhanced moderately. Specifically, as shown in FIG. 7, the control unit 18 sets both of the high-band adjustment value G[H] and the low-band adjustment value G[L] to the numerical value g1, and sets the degree of enhancement V to the numerical value v1. The cutoff frequency F[H] is set to 8 kHz, and the variation D[H] is set to 8 kHz.

There are many cases where, in the sound signal SA recorded at a recent time, the volume in the high-tone band and the low-tone band is maintained moderately compared to the sound signal SA recorded at an old time. Accordingly, when the recording reference time designated by the attribute information PB is after a predetermined date and time, the numerical values of the parameters are set such that the enhancement in the high-tone band and the low-tone band is suppressed compared to the attribute information PB designates the recording reference time before the concerned date and time. Specifically, as shown in FIG. 7, the control unit 18 sets both of the high-band adjustment value G[H] and the low-band adjustment value G[L] to the numerical value g0, and sets the degree of enhancement V to the numerical value v1. The cutoff frequency F[H] is set to 10 kHz, and the variation D[H] is set to 6 kHz. In the fourth embodiment, the same effects as in the second embodiment are realized.

<Modifications>

The foregoing embodiments may be modified in various ways. Specific modifications will be described below. Two or more forms arbitrarily selected from the following illustration may be appropriately combined.

(1) The attribute designated by the attribute information PB is not limited to the foregoing illustration. For example, a configuration in which the type of the external device which supplies the sound signal SA to the sound processing apparatus 100B is designated by the attribute information PB may be used. Specifically, the characteristic (the degree of attenuation of the high-tone band or low-tone band) of the sound signal SA differs depending on whether the supply source of the sound signal SA is a portable recording medium, such as a USB (Universal Serial Bus) memory, a communication network, such as the Internet or a telephone network, or a reception circuit of a broadcast wave. Accordingly, similarly to each form described above, the numerical value of each parameter which is applied to the band expansion processing is set to an appropriate numerical value for the sound signal SA supplied from the external device designated by the attribute information PB.

(2) Although in each embodiment described above, the band expansion processing for shifting the fundamental component CA[H] and the fundamental component CA[L] on the frequency domain has been illustrated, the content of the band expansion processing is not limited to the above illustration. For example, a configuration in which nonlinear processing, such as rectification or clipping, is executed on the high-band fundamental component CA[H] to generate the harmonic (the expanded component CB[H]) may be used. The control unit 18 variably controls the parameters, such as the clip amount. A configuration in which processing, such as frequency division, is executed on the low-band fundamental component CA[L] to generate the low-band expanded component CB[L] (for example, a component with a frequency of ½ of the frequency of the fundamental component CA[L]) may be used. The control unit 18 variably controls the parameters, such as the frequency division ratio of the fundamental component CA[L]. As will be understood from the above description, the band expansion processing is included as processing for adding the expanded component (CB[H], CB[L]) generated from the sound signal SA (in the illustration of each form described above, the fundamental component (CA[H], CA[L]) in the specified band (B[H], B[L])) to the sound signal SA. A specific method of generating the expanded component (CB[H], CB[L]) from the sound signal SA or the kind of each parameter which is controlled by the control unit 18 is arbitrary.

(3) A configuration in which the presence/absence of the execution of the band expansion processing is switched may be used. For example, a configuration in which, when the sound signal SA which is band-limited by audio compression is supplied, similarly to each embodiment described above, the band expansion processing is executed, and when the sound signal SA (for example, an uncompressed sound signal SA recorded in a recording medium, such as a CD) which is not band-limited is supplied, the band expansion processing is not executed may be preferably used.

(4) Although in the first embodiment, the parameters of the band expansion processing are set in accordance with the mode information PA, and although in the second embodiment to the fourth embodiment, the parameters of the band expansion processing are set in accordance with the attribute information PB, a configuration in which both of the mode information PA and the attribute information PB are applied to set the parameters of the band expansion processing may be used. That is, the information acquisition unit 16A in the first embodiment and the information acquisition unit 16B in the second embodiment to the fourth embodiment are included as components which acquire control information including at least one of the mode information PA for designating the reproduction mode selected by the user and the attribute information PB for designating the attribute of information represented by the sound signal SA.

This application is based upon and claims the benefit of priority of Japanese Patent Application No. 2011-279575 filed on Dec. 21, 2011, the contents of which are incorporated herein by reference in its entirety.

What is claimed is:

1. A sound processing apparatus, comprising:
an information acquisition unit which acquires control information including at least one of mode information for designating a reproduction mode of the sound processing apparatus and attribute information for designating an attribute of an audio content represented by a sound signal;
a frequency band expansion unit which performs frequency band expansion processing for adding an expanded component generated from the sound signal to the sound signal, wherein the frequency band expansion processing is performed based on the sound signal having undergone sound compression; and
a control unit which changes parameters to be applied to the frequency band expansion processing in accordance with the control information acquired by the information acquisition unit, wherein
the frequency band expansion unit shifts a fundamental component by a given shift amount in a specified frequency band of the sound signal on a frequency domain to generate the expanded component, and
the control unit controls a frequency range of the specified frequency band and the given shift amount of the fundamental component in accordance with the control information acquired by the information acquisition unit.

2. The sound processing apparatus according to claim 1, wherein
the frequency band expansion processing includes processing for adjusting an intensity of the expanded component, and
the control unit controls an adjustment value of the intensity of the expanded component in accordance with the control information acquired by the information acquisition unit.

3. The sound processing apparatus according to claim 1, wherein
the sound signal is a signal which is frequency-band-limited by audio compression.

4. The sound processing apparatus according to claim 1, wherein
the information acquisition unit acquires, from a broadcast signal including the sound signal, attribute information for designating the type of information represented by the broadcast signal.

5. The sound processing apparatus according to claim 1, wherein
the information acquisition unit acquires the control information including at least attribute information for designating a recording reference time of the audio content, and
the control unit changes the parameters to be applied to the frequency band expansion processing based on a comparison result of the recording reference time and a predetermined date and time.

6. The sound processing apparatus according to claim 1, wherein
the information acquisition unit acquires attribute information associated with a music file format.

7. The sound processing apparatus according to claim 6, wherein
the information acquisition unit acquires attribute information for designating a type of music of the audio content, and
the control unit variably controls the parameters to be applied to the frequency band expansion processing in accordance with the type of music designated by the attribute information.

8. A sound processing method, comprising:
acquiring control information including at least one of mode information for designating a reproduction mode of a sound processing apparatus and attribute information for designating an attribute of an audio content represented by a sound signal;
executing frequency band expansion processing for adding an expanded component generated from the sound signal to the sound signal, wherein the frequency band expansion processing is performed based on the sound signal having undergone sound compression; and
changing parameters to be applied to the frequency band expansion processing in accordance with the acquired control information, wherein
a fundamental component is shifted by a given shift amount in a specified frequency band of the sound signal on a frequency domain to generate the expanded component, and
a frequency range of the specified frequency band and the given shift amount of the fundamental component are controlled in accordance with the acquired control information.

* * * * *